United States Patent [19]

[11] 3,735,206

Pesek

[45] May 22, 1973

[54] CIRCUIT BOARD PACKAGE WITH WEDGE SHAPED COVERS

[75] Inventor: Clarence T. Pesek, Anoka, Minn.

[73] Assignee: The United States of America as represented by the Administrator of the National Aeronautics and Space Administration, Washington, D.C.

[22] Filed: Oct. 28, 1971

[21] Appl. No.: 193,456

[52] U.S. Cl. ............................317/100, 317/101 DH
[51] Int. Cl. ............................H05k 5/03, H05k 7/20
[58] Field of Search ..................174/DIG. 5; 317/100, 317/101 D, 101 DH, 120

[56] References Cited

UNITED STATES PATENTS

| | | | |
|---|---|---|---|
| 2,881,364 | 4/1959 | Demer | 317/100 |
| 3,264,534 | 8/1966 | Murphy | 317/100 |
| 3,566,190 | 2/1971 | Huebner | 317/101 DH |

*Primary Examiner*—Robert K. Schaefer
*Assistant Examiner*—Gerald P. Tolin
*Attorney*—L. D. Wofford, Jr., J. R. Manning and J. H. Beumer

[57] ABSTRACT

A circuit board mounting and packaging technique wherein each board is encased within a wedge-shaped foam package and the packages are combined in complementary pairs and inserted in chassis compartments.

5 Claims, 3 Drawing Figures

CLARENCE T. PESEK
INVENTOR.

BY Charles J. Ungemach
ATTORNEY

CLARENCE T. PESEK
INVENTOR
BY Charles J. Ungemach
ATTORNEY

CIRCUIT BOARD PACKAGE WITH WEDGE SHAPED COVERS

The invention described herein was made in the performance of work under a NASA contract and is subject to the provisions of the National Aeronautics and Space Act of 1958, Public Law 85-568 (72 Stat. 435; 42 U.S.C. 2457), as amended.

BACKGROUND OF THE INVENTION

The invention pertains generally to the field of packaging and mounting electronic components and specifically to a technique for packaging and mounting printed circuit boards. The technique protects printed wiring boards from vibration, conducts component-generated heat to the chassis, augments chassis rigidity and damping, and protects the circuits from contamination.

SUMMARY

Each printed wiring board is housed or packaged in a pair of contoured polyurethane foam covers. Thermal pads are incorporated into one of the covers of a pair and conduct heat from components on the board to the chassis. The wedge shape of the other cover of a pair gives each cover-pair a tapered or wedge-shaped profile. The internal contour of each cover of a pair precisely matches the profile of the printed circuit board assembly for maximum support, but the covers are readily removable for inspection or repair. Two of the boards with their associated covers are mounted in each chassis compartment. The tapered thicknesses of the packages are complementary and when the packages are moved laterally with respect to one another the total thickness of the pair of packages changes. A compression lock mechanism associated with each pair of packages produces this movement and the resulting increase in thickness wedges the pair of packages in compression in the chassis compartment. Keying between the circuit boards and the foam covers prevents stress on the components mounted on the board by preventing relative motion between a board and its covers.

DESCRIPTION

Figure 1:
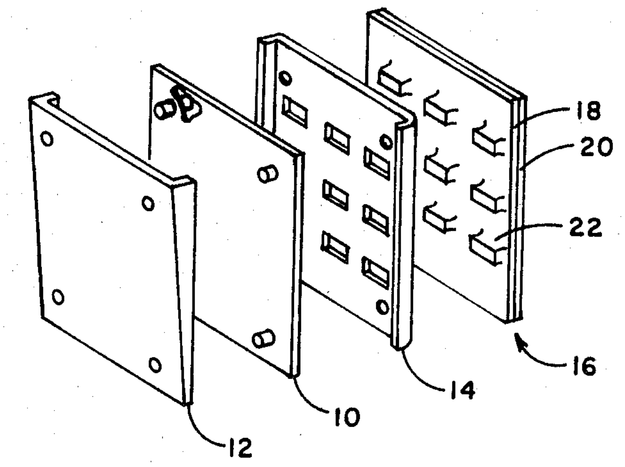
FIG. 1 is an exploded view of a single circuit board and its package.

In FIG. 1 a printed circuit board 10 is housed in an assembly comprising a pair of contoured polyurethane foam covers 12 and 14 and a heat transfer layer 16 which forms a part of cover 14. Layer 16 is formed of two sub-layers 18, 20 of metal foil between which is placed metal "wool" to form raised portions or pads 22 which protrude through apertures in cover 14. Pads 22 contact and conduct heat away from the components mounted on board 10. The metal foil and "wool" may be aluminum or copper. The wedge shape of cover 12 gives the assembly a tapered profile. Cover 14, instead of cover 12, may be tapered. To provide maximum support the internal contours of covers 12 and 14 are molded to match the contours of board 10. Covers 12 and 14 are readily removable for inspection or repair of board 10. The assembly of FIG. 1 is referred to as a "foam-pack assembly." The covers need not necessarily be of polyurethane foam and other material may be substituted.

Figure 2:
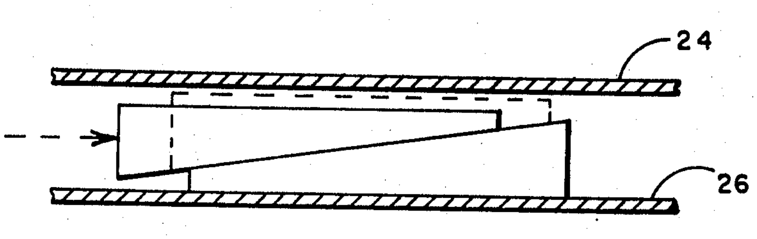
FIG. 2 schematically shows a complementary pair of printed circuit board packages mounted between the side walls of a chassis compartment.

FIG. 2 shows a pair of the assemblies of FIG. 1 mounted between side walls 24 and 26 of a chassis compartment. The tapered profiles or thicknesses are complementary and relative lateral movement causes a change in the total thickness of the assembly-pair. If for example the upper assembly is moved to the right the total thickness increases, as shown by the dashed line, and this wedges or compresses the assembly-pair firmly between side walls 24 and 26 of the chassis compartment.

Figure 3:
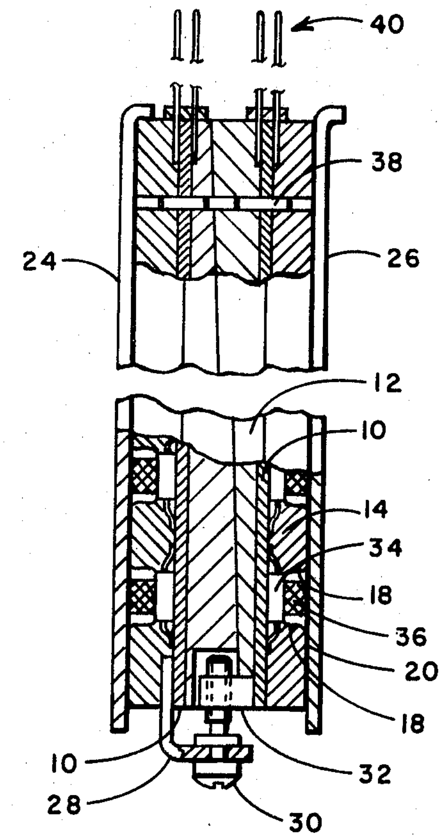
FIG. 3 is a detailed cross sectional view of a complementary pair of printed circuit board packages wedged between the side walls of a chassis compartment.

The relative movement shown schematically in FIG. 2 is provided by a compression lock mechanism, an example of which is shown in FIG. 3. A bracket 28 is attached to the left-hand board 10 and holds a screw 30. The threaded portion of screw 30 engages a lug 32 attached to the right-hand board 10. Relative lateral movement of the left and right assemblies is provided by turning screw 30. Other equivalent compression lock mechanisms may be used. FIG. 3 shows integrated circuits 34 mounted on boards 10 and metal "wool" 36 between metal foil layers 18 and 20 at points opposite the integrated circuits or other components which require the removal of transfer of heat. Numeral 38 refers to keying between the printed circuit boards and the adjacent rigid foam to prevent relative movement of a board and its associated rigid foam covers. An electrical connector 40 is associated with each board 10.

The invention is not limited to the particular species shown, which may be modified in a number of ways and still retain the essence of the invention. The invention is to be limited only by the following claims.

I claim:

1. A circuit board package assembly adapted for mounting in a chasis compartment comprising:

a pair of circuit boards each having components mounted on one side thereof;

a pair of covers for each circuit board, each of said pairs of covers forming a wedge in cross section and encasing one of said boards;

one cover in each pair being contoured to fit over the component side of one of said boards and having apertures opposite component locations on the board and the other cover in each pair being contoured to fit over the other side of one board;

a heat conductive layer mounted on the external surface of said one cover and protruding through said apertures; and means attached to said boards to provide relative movement thereof;

the covered boards being disposed with a major portion of their sides in contact so that relative movement of the boards will effect a change in thickness of the assembly.

2. The assembly of claim 1 wherein the other of said covers of each pair is tapered.

3. The assembly of claim 1 wherein the means attached to said boards to provide relative movement thereof comprises:

a lug mounted on one of the boards; and a bracket holding a screw and mounted on the other board, the screw engaging the lug, relative movement of the covered boards being provided by turning the screw.

4. The assembly of claim 1, wherein said covers are made of polyurethane foam material.

5. The assembly of claim 1 wherein the heat conductive layer comprises two sub-layers of metal foil between which is placed metallic material forming raised pads which protrude through the apertured covers.

* * * * *